United States Patent [19]

Breu

[11] Patent Number: 4,782,991
[45] Date of Patent: Nov. 8, 1988

[54] HOT LIQUID SOLDER REFLOW MACHINE

[75] Inventor: Dennis L. Breu, Stillwater, Minn.

[73] Assignee: Unisys Corporation, Blue Bell, Pa.

[21] Appl. No.: 124,714

[22] Filed: Nov. 24, 1987

[51] Int. Cl.⁴ .......................... B23K 3/00; B23K 3/06; B23K 37/06
[52] U.S. Cl. ..................... 228/19; 228/40; 228/191; 228/264
[58] Field of Search ............... 228/19, 56.1, 191, 264, 228/37, 39, 40

[56] References Cited

U.S. PATENT DOCUMENTS

| | | | |
|---|---|---|---|
| 3,684,151 | 8/1972 | Burman et al. | 228/19 |
| 3,773,261 | 11/1973 | Helton | 239/133 |
| 4,115,601 | 9/1978 | Amman et al. | 427/96 |
| 4,187,973 | 2/1980 | Fortune | 228/20 |
| 4,256,512 | 3/1981 | Amman et al. | 134/64 |
| 4,426,571 | 1/1984 | Beck | 219/373 |
| 4,518,110 | 5/1985 | Breske et al. | 228/20 |
| 4,561,584 | 12/1985 | Hug | 228/19 |
| 4,659,002 | 4/1987 | Wallgren et al. | 228/264 |

FOREIGN PATENT DOCUMENTS

| | | | |
|---|---|---|---|
| 50701 | 5/1982 | European Pat. Off. | 228/264 |
| 2119402 | 10/1972 | Fed. Rep. of Germany | 228/19 |
| 138862 | 11/1979 | German Democratic Rep. | 228/19 |
| 32488 | 10/1973 | Japan | 228/19 |

OTHER PUBLICATIONS

Kristiansen F., "Nozzle For Reflow Soldering," IBM Technical Disclosure Bulletin, vol. 11 No. 5, Oct. 1968, p. 482.
Vavoso G., "Removal of Soldered Components," IBM Technical Disclosure Bulletin, vol. 12 No. 12, May 1970, p. 2221.
Tickner C. R., "Chip Removal by Hot Gas," IBM Technical Disclosure Bulletin, vol. 11 No. 7, Dec. 1968, p. 875.
Trollman C., "Solder Reflow Tool," IBM Technical Disclosure Bulletin, vol. 11 No. 10, Mar. 1969, p. 1298.
Dingman E. G., "Solvent Vapor Solder Reflow," IBM Technical Disclosure Bulletin, vol. 13 No. 3, Aug. 1970, p. 639.

Primary Examiner—Nicholas P. Godici
Assistant Examiner—Samuel M. Heinrich
Attorney, Agent, or Firm—Glenn W. Bowen; Laurence J. Marhoefer

[57] ABSTRACT

A solder reflow machine for removing and replacing electronic components of the pin-grid array type having a large number of leads soldered into a very densely populated printed circuit board. The machine utilizes a heat-transfer liquid and a vacuum to remove the component from the board. The printed circuit board is positioned with the component facing downwardly. A tank containing the heat-transfer liquid is located below the printed circuit board. The apparatus includes a solder reflow head which has a component-engaging vacuum plate with a central opening that is in communication with a vacuum source through a pipe which is pulled downwardly to remove the component. The component is surrounded by a wall in combination with the bottom of the printed circuit board and seals off the liquid flow path. The heat-transfer liquid is pumped up through a pipe that extends into a storage tank so that it flows into, an input passageway in the solder reflow head over the component leads to reflow the solder and down an exit passageway.

6 Claims, 2 Drawing Sheets

HOT LIQUID SOLDER REFLOW MACHINE

BACKGROUND OF THE INVENTION

The present invention relates to solder reflowing methods and machines, and in particular to methods and machines for removing very small electronic components which have a very high pin density from a printed circuit board which has a large number of such component types in close proximity.

Various types of heat transfer fluids have been utilized to reflow solder so as to allow the removal of components from printed circuit boards. These include super-heated air, or nitrogen or other gas, liquid solder, direct mechanical contact with a heated object, such as a soldering iron or a hot plate. These methods are generally disadvantageous because they have a low efficiency of heat-transfer and their usage often results in excessively long heating times for the components and the boards, which causes thermal stresses in both the boards and the components, which may result in damage or failure of either, or both. In addition, the time for achieving removal is longer than optimum.

The combination of the use of a hot gas to reflow the solder for a multi pin component in a vacuum to control the placement or removal of a multi pin component is shown in two IBM Technical Disclosure Bulletins. The first is "Chip Removal by Hot Gas" by C. R. Tickner, Vol. 11 No. 7, December 1968, p. 875, and "Solder Reflow Tool" by C. Trollman, Vol. 11 No. 10, March 1969, p. 1298.

Another IBM Technical Disclosure Bulletin "Solvent Vapor Solder Reflow" by E. G. Dingman, Vol. 13 No. 3, August 1970, p. 639, indicates that a boiling solvent may be used to facilitate removal and resolder of electronic components. The present invention is able to utilize a liquid, or fluid, heat transfer material where the temperature of the fluid may be raised to a temperature sufficient to cause the solder to reflow, but the fluid does not have to be in a boiling state, although it could be if necessary.

BRIEF DESCRIPTION OF THE DRAWINGS

The present invention is described by reference to the drawings in which.

SUMMARY OF THE INVENTION

A solder reflow machine is provided which is able to use a heat-transfer fluid in a manner such that the liquid heat transfer fluid is applied directly to the heads of a multi-pin component that is soldered to a printed circuit board. The removal of the component is achieved by means of a vacuum which is coupled through a pipe to a solder reflow head from a vacuum source. The pipe is movable up and down so that a vacuum plate in the solder reflow head may engage the component, and pull it away from the printed circuit board by suction when the solder has liquefied. A heat-transfer liquid pipe extends vertically to the solder reflow head to supply the heat to reflow the solder. A tank containing the heat-transfer liquid includes a submersible pump which pumps the liquid to the solder reflow head where the fluid enters one portion of the chamber, flows past the leads and down another portion of the liquid chamber to be returned to the storage tank.

TECHNICAL DESCRIPTION OF THE INVENTION

Figure 1:
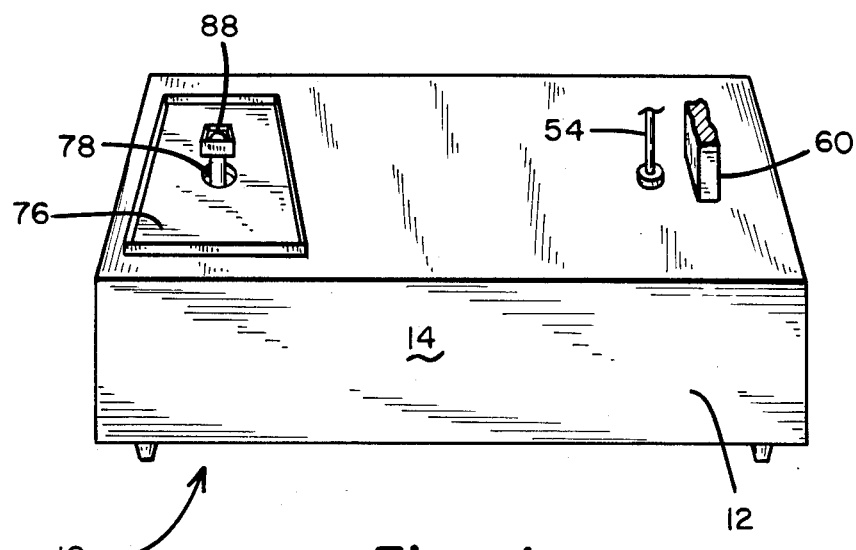
FIG. 1 shows an overall perspective view of the solder reflow machine of the present invention, but with the stirring motor and the control box not shown.
Figure 2:
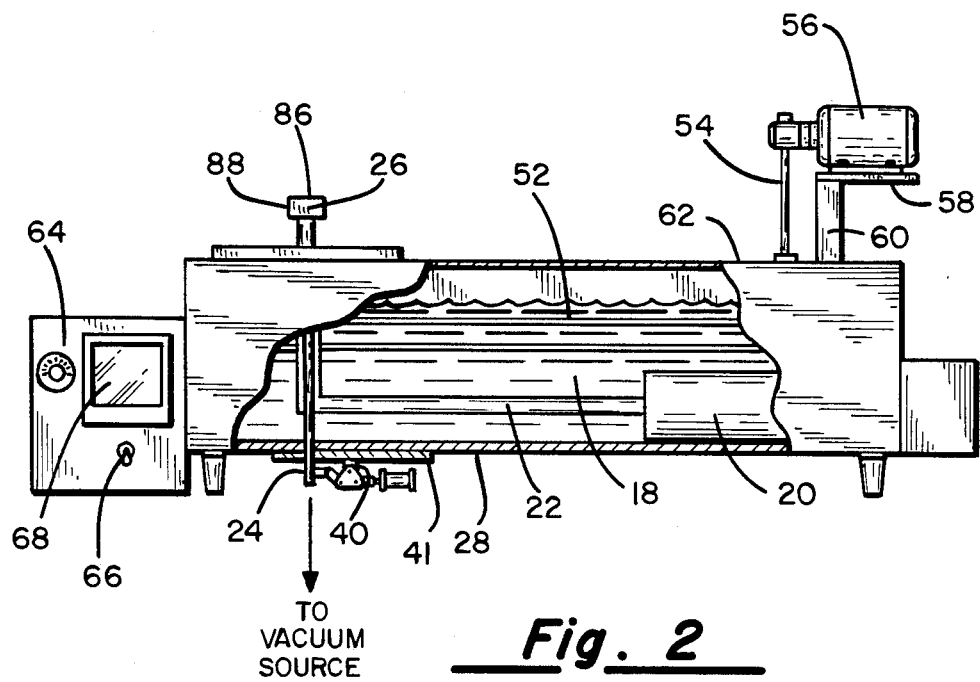
FIG. 2 shows a partial cross-sectional side view of the machine of FIG. 1 with a stirring motor and the control box shown.

The overall perspective view is shown of the solder reflow machine 10 of the present invention in FIG. 1. The tank 12 is formed of a metal housing 14 which contains a heat transfer liquid 18, as shown in FIG. 2. A submersible pump 20 is positioned in the heat-transfer liquid. Although a pump other than a submersible pump could be employed, it is desirable that the pump be submersible for compactness. The pump is coupled to a pipe 22 which extends horizontally along the tank until it reaches the vicinity of a vertically oriented vacuum pipe 24. The liquid pipe 22 then takes the right angled bend and also extends upwardly toward the solder reflow head 26.

The vacuum pipe 24 runs from the center of the solder reflow head 26 through the bottom 28 of the housing, which is suitably sealed against leakage, to a vacuum source (not shown). The vacuum pipe 24 is movable up and down within the liquid tank.

Figure 5:
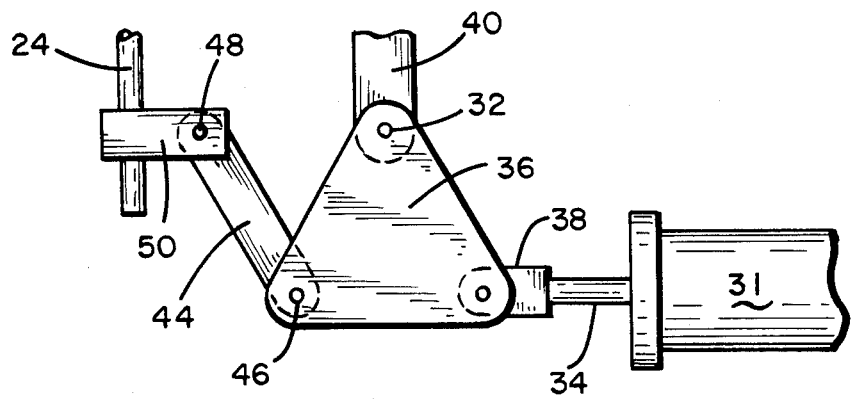
FIG. 5 is an enlarged view of the actuating mechanism for driving the vacuum plate that engages a component that is to be removed from a printed circuit board up and down.

Control of the movement of the vacuum pipe vertically is obtained by use of the actuatable piston and cylinder assembly 31, (FIG. 5), which drives the piston rod 34 back and forth in the horizontal direction. The piston rod 34 is coupled to generally triangular shaped actuator 36 by means of the coupler 38. The actuator 30 pivots about the coupling point 32 which is linked by the coupler 40 to a support 41 plate that is attached to the tank 12. The actuator 36 is also coupled to the link 44, which is pivotable about the coupling points 46 and 48. Coupling point 48 of the link 44 is secured to the connecting strap 50, that is in turn secured to the vacuum pipe 24. The actuation and de-actuation of the piston 32 thereby causes the vacuum pipe to move up or down, as desired.

A stirrer mechanism for agitating the liquid consisting of the belt 52 is shown in FIG. 2, the drive shaft 54, the drive motor 56 and a mechanism for driving the belt (not shown) such as pulleys may be included as an optional item. The motor 56 may be supported by a support plate 58 and a bracket 60 which extend upwardly from the upper surface 62 of the housing 14.

The control mechanism for the system is contained in the control box 64 which is turned on and off by means of the switch 66. A scope, or meter, 68 may be incorporated into the control box. The control box 64 is coupled to control the vacuum source, activation of the piston and operation of the pump through electrical lines (not shown).

Figure 3:
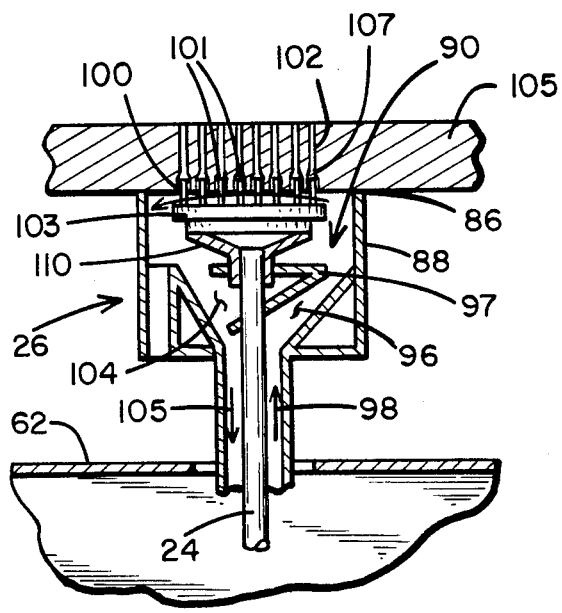
FIG. 3 is a partial cross-sectional view which shows the solder reflow head portion of the machine taken along the lines 3—3 of FIG. 2.
Figure 4:
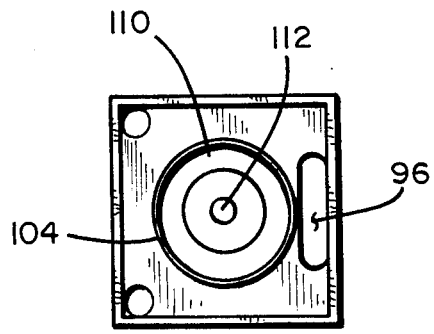
FIG. 4 is a top view of the solder reflow head.

The liquid pipe 22 is secured to the upper support plate 76 which is inserted into the left-hand portion of the upper wall 62 of the housing 14. A hole 78 is formed in this plate and through the upper wall 62, and it is through this hole that the upper portion of the pipe 22 extends. The solder reflow head 26 is open at its top end so that the printed circuit board 105 containing the components 103 with the multiple soldered leads 101 may be positioned directly against the top edge 86 of the outer wall 88 of the liquid-flow chamber which is of a size that is slightly larger than the component. Hot incoming heat-transfer fluid is directed up through the inlet passageway 96, as indicated by the arrow 98. The baffles 97 aid in directing the liquid flow in the proper direction. Hot incoming heat-transfer fluid is directed into the right side of the chamber 90, as shown in FIG. 3. The liquid then flows to the left, as indicated by the arrow 100, across the leads 101 of the component 103 which are soldered into the female connectors 102 in the printed circuit board 105. This causes the solder 107 that is on the leads 101 and the connectors 102 is liquefied so that the component 103 may be removed from the board 105 The heat-transfer liquid then flows down the passageway exit 104, as indicated by the arrow 105 to be returned to the tank 12.

The returned liquid may be discarded, but generally it may be reused for long periods of time without replacement since contamination of the liquid by the solder will be very slight in the described apparatus. Once the heat-transfer liquid has melted the solder, and caused reflow, the piston and cylinder assembly 31 is actuated and the vacuum source is turned on to supply a vacuum to the vacuum pipe 24 which is moved upwardly toward the component 103. At the top of the pipe 24 is a circular vacuum plate 110 which has a hollow conical cross-section with a central opening 112 that is in communication with the pipe 24 in order to apply suction to the component 103 when a vacuum exists in the pipe. When the vacuum plate 110 is in contact with the component it may then be pulled down by the vacuum plate and removed from the printed circuit board since the solder has been melted.

The liquid heat-transfer material which is used in the present invention is preferably a white mineral oil. One suitable such liquid is sold by the Multitherm Corporation under the trade-mark Multitherm PG-1. This a clear and odorless liquid which represents only a moderate fire hazard. There are other suitable liquids, including petroleum and hydrocarbon liquids, which may be employed. The particular preferred liquid, however, is Multitherm PG-1 which has a boiling point of 600° F. Thus, this liquid may be used with the solder reflow machine of the present invention to remove components from printed boards with solders which have a melting point of less than 600° F. One particular advantage of the Multitherm liquid is that it has a high dielectric constant. This is particularly desirable when dissimilar metals appear in the system and galvanic corrosion will be minimized. It also has a relatively low viscosity, and thus requires less horsepower than other types of fluids which are often used in heat-transfer applications and it has good thermal stability.

What is claimed is:

1. A solder reflow machine for removing a component having a plurality of leads which are soldered to connectors in a printed circuit board comprising storage means for holding a heat transfer liquid, vacuum source, vacuum conduit means coupled to said vacuum source, pump means for pumping said heat transfer liquid from said storage means, liquid conduit means coupled to said pump means to receive said heat-transfer liquid, solder reflow means comprising vacuum plate means in vacuum communication with said vacuum for creating a suction on said component when a vacuum occurs in said vacuum conduit means and liquid channel means in liquid communication with said liquid conduit means for conducting said heat-transfer liquid past said leads and said vacuum plate means, and control means for selectively moving said vacuum plate means into engagement with said component and then pulling said component away from said board.

2. A solder reflow machine as claimed in claim 2 wherein said liquid conduit means is open at one end, is of a size that is larger than the size of said component and has an upper edge that is positioned in intimate contact with said printed circuit board such that said liquid conduit means and said printed circuit board in combination effectively seal off said liquid channel means.

3. A solder reflow machine as claimed in claim 2 wherein said liquid channel means are further constructed so that said heat-transfer liquid is directed through said liquid chamber in a path from an inlet passageway on one side of said liquid chamber, across the leads of the component that are soldered to connectors in the printed circuit board and down through an exit passageway in an opposite side of said liquid chamber.

4. A solder reflow machine as claimed in claim 3 wherein said vacuum plate means is centrally located in said liquid channel means and is secured to said vacuum conduit means so that said vacuum plate means moves with said vacuum conduit means.

5. A solder reflow machine as claimed in claim 4 wherein said liquid conduit means is open at one end, is of a size that is larger than the size of said component and has an upper edge that is positioned in intimate contact with said printed circuit board such that said liquid conduit means and said printed circuit board in combination effectively seal off said liquid channel means.

6. A solder reflow machine as claimed in claim 5 wherein said liquid containing chambers are further constructed so that said heat-transfer liquid is directed through said liquid chamber in a path from an inlet passageway on one side of said liquid chamber, across the leads of the component that are soldered to connectors in the printed circuit board and down through an exit passageway in an opposite side of said liquid channel means.

* * * * *